United States Patent
Lilak et al.

(10) Patent No.: US 10,636,907 B2
(45) Date of Patent: Apr. 28, 2020

(54) DEEP EPI ENABLED BY BACKSIDE REVEAL FOR STRESS ENHANCEMENT AND CONTACT

(71) Applicant: Intel Corporation, Santa Clara, CA (US)

(72) Inventors: Aaron D. Lilak, Beaverton, OR (US); Stephen M. Cea, Hillsboro, OR (US); Rishabh Mehandru, Portland, OR (US); Patrick Morrow, Portland, OR (US); Patrick H. Keys, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/747,111

(22) PCT Filed: Sep. 25, 2015

(86) PCT No.: PCT/US2015/052464
§ 371 (c)(1),
(2) Date: Jan. 23, 2018

(87) PCT Pub. No.: WO2017/052649
PCT Pub. Date: Mar. 30, 2017

(65) Prior Publication Data
US 2018/0212057 A1    Jul. 26, 2018

(51) Int. Cl.
*H01L 29/78* (2006.01)
*H01L 27/088* (2006.01)
(Continued)

(52) U.S. Cl.
CPC ...... *H01L 29/7848* (2013.01); *H01L 27/0886* (2013.01); *H01L 27/1211* (2013.01);
(Continued)

(58) Field of Classification Search
CPC ............. H01L 29/1054; H01L 29/7848; H01L 29/7849; H01L 29/66795; H01L 29/785;
(Continued)

(56) References Cited

U.S. PATENT DOCUMENTS

| 2003/0148584 A1 | 8/2003 | Roberds et al. |
| 2008/0116482 A1 | 5/2008 | Chong et al. |

(Continued)

OTHER PUBLICATIONS

Properties of Si described by AZO Materials (Year: 2001).*
(Continued)

*Primary Examiner* — Erik T. K. Peterson
*Assistant Examiner* — Christopher M Roland
(74) *Attorney, Agent, or Firm* — Schwabe, Williamson & Wyatt, P.C.

(57) ABSTRACT

Embodiments of the invention include a non-planar transistor with a strained channel and methods of forming such a transistor. In an embodiment, the non-planar transistor may include a semiconductor substrate. According to an embodiment, a first source/drain (S/D) region and a second S/D region may be formed over the semiconductor substrate and separated from each other by a channel region. A gate stack may be formed over the channel region. In order to increase the amount of strain that may be induced in the channel region, embodiments may include forming a strain enhancement opening in the semiconductor substrate that removes at least a portion of the semiconductor substrate from below the channel region.

22 Claims, 10 Drawing Sheets

(51) Int. Cl.
   *H01L 27/12*      (2006.01)
   *H01L 29/10*      (2006.01)
   *H01L 29/66*      (2006.01)
(52) U.S. Cl.
   CPC .... *H01L 29/1054* (2013.01); *H01L 29/66795* (2013.01); *H01L 29/785* (2013.01); *H01L 29/7842* (2013.01); *H01L 29/7849* (2013.01)
(58) Field of Classification Search
   CPC ............. H01L 27/0886; H01L 27/0924; H01L 27/1211
   See application file for complete search history.

(56) References Cited

U.S. PATENT DOCUMENTS

| | | | | |
|---|---|---|---|---|
| 2011/0241073 A1* | 10/2011 | Cohen | ............ | H01L 21/823412 257/192 |
| 2012/0315760 A1 | 12/2012 | Yu et al. | | |
| 2013/0005096 A1 | 1/2013 | Part et al. | | |
| 2013/0105860 A1* | 5/2013 | Lochtefeld | ........ | H01L 21/02381 257/190 |
| 2013/0130479 A1* | 5/2013 | Stuber | ..................... | H01L 21/84 438/479 |
| 2013/0307038 A1* | 11/2013 | Toh | ................... | H01L 29/66795 257/288 |
| 2013/0341639 A1 | 12/2013 | Toh et al. | | |
| 2015/0249056 A1* | 9/2015 | Molin | ................... | H01L 23/562 257/506 |

OTHER PUBLICATIONS

Properties of SiC described by AZO Materials (Year: 2001).*
International Search Report and Written Opinion for International Patent Application No. PCT/US2015/052464 dated Jun. 20, 2016, 13 pgs.
International Preliminary Search Report for International Patent Application No. PCT/US2015/052464, dated Apr. 5, 2018, 10 pages.

* cited by examiner

US 10,636,907 B2

DEEP EPI ENABLED BY BACKSIDE REVEAL FOR STRESS ENHANCEMENT AND CONTACT

CROSS-REFERENCE TO RELATED APPLICATION

This patent application is a U.S. National Phase Application under 35 U.S.C. § 371 of International Application No. PCT/US2015/052464, filed Sep. 25, 2015, entitled "DEEP EPI ENABLED BY BACKSIDE REVEAL FOR STRESS ENHANCEMENT & CONTACT," which designates the United States of America, the entire disclosure of which is hereby incorporated by reference in its entirety and for all purposes.

FIELD OF THE INVENTION

The present invention relates generally to the manufacture of semiconductor devices. In particular, embodiments of the present invention relate to non-planar semiconductor devices with backside stress inducing layers.

BACKGROUND OF THE INVENTION

A key design parameter for a metal-oxide-semiconductor (MOS) transistor device is the current delivered at a given designed voltage. This parameter is commonly referred to as the drive current or saturation current ($I_{Dsat}$). One factor that has an effect on the drive current is the carrier mobility of the channel region. Increases in the carrier mobility in the channel region result in increases in the drive current. The carriers in NMOS and PMOS transistors are electrons and holes, respectively. The electron mobility of the channel region in NMOS devices may be increased by exposing the region to a uniaxial tensile strain. Alternatively, the hole mobility of the channel region in PMOS devices may be increased by applying a uniaxial compressive strain on the channel region.

Currently, channel strain may be introduced into the device by either epitaxially depositing a layer over the surface of the source/drain (S/D) regions or by replacing the S/D regions with materials that are different than the material used for the channel region. The strain is induced by creating lattice constant mismatches between the layers. For example, when an epitaxially deposited layer is formed over the S/D regions, the epitaxy layer may have a different lattice constant than the S/D regions. Alternatively, when the S/D regions are replaced, the replacement S/D regions may have a lattice constant that is different than the channel region. The amount of strain that can be induced in the channel has several limits. The amount of strain that can be induced in the channel is limited by the physical structure of the transistor. One limiter upon the amount of strain which can be induced in the channel region, is the strain in the substrate material existing beneath the channel region.

DETAILED DESCRIPTION OF THE INVENTION

Described herein are systems that include a semiconductor device and methods of forming such semiconductor devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, the carrier mobility may be increased by inducing strain in the channel region. Embodiments of the invention include inducing strain in the channel by either forming a strain inducing layer on the backside of the transistor device and/or by removing the strain limiting semiconductor substrate on which the channel region is formed. As described above, the presence of the substrate below the channel region limits the amount of strain that can be induced in the channel. Accordingly, embodiments of the invention may utilize a backside reveal process after the transistor has been formed that can expose the backside of the transistor. With the backside of the transistor revealed, embodiments of the invention may either remove the semiconductor substrate below the channel region, the source/drain (S/D) regions, or a combination of the both. Additionally, when the semiconductor substrate below the transistor is revealed, a strain inducing epitaxial layer may also be formed to further increase the strain in the channel. Embodiments of the invention may also include forming a strain inducing layer on the front side and on the backside of the transistor.

Figure 1A:
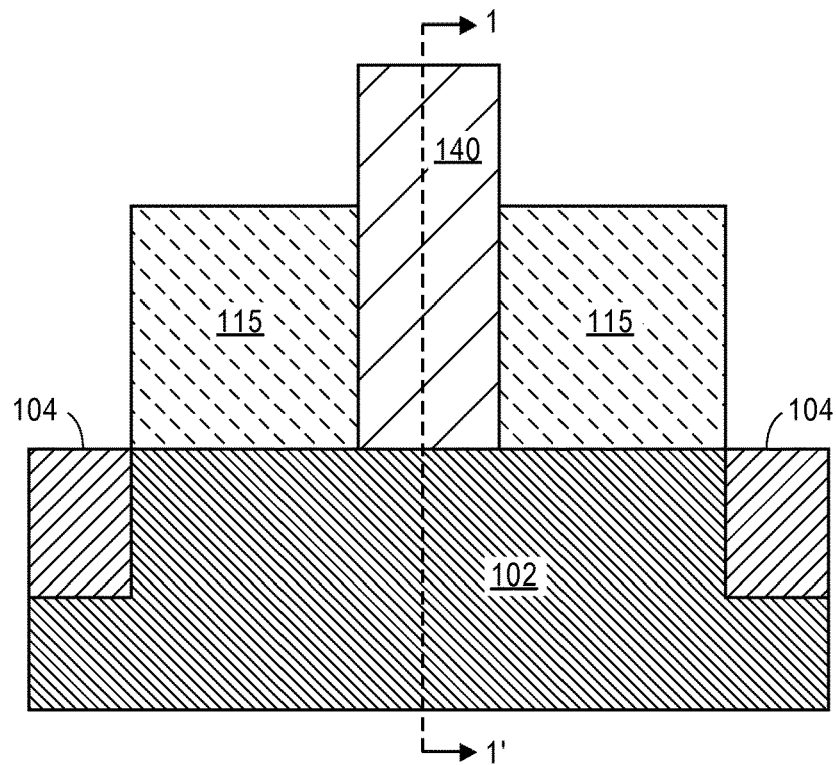
FIG. 1A is a pair of cross-sectional illustrations of a non-planar transistor, according to an embodiment of the invention.

FIG. 1A is a cross-sectional illustration of a non-planar transistor device that does not include a strain inducing layer. As illustrated in FIG. 1A, a single transistor device is shown, but embodiments are not limited to such configurations, and it is understood that a plurality of transistors, such as metal-oxide-semiconductor field-effect transistors (MOSFET or simply MOS transistors), may be fabricated on the substrate. In various embodiments of the invention, the MOS transistors may be planar transistors, nonplanar transistors, or a combination of both. In the illustrated embodiment a non-planar transistor is shown. Non-planar transistors include FinFET transistors such as double-gate transistors and tri-gate transistors, and wrap-around or all-around gate transistors, such as nanoribbon and nanowire transistors.

Embodiments of the invention may be formed or carried out on a substrate 102, such as a semiconductor substrate. In one embodiment, the semiconductor substrate 102 may be a crystalline substrate formed using a bulk silicon or a silicon-on-insulator substructure. In other implementations, the semiconductor substrate 102 may be formed using alternate materials, which may or may not be combined with silicon, that include but are not limited to germanium, indium antimonide, lead telluride, indium arsenide, indium phosphide, gallium arsenide, indium gallium arsenide, gallium antimonide, silicon germanium, or other combinations of group III-V or group IV materials. Although a few examples of materials from which the substrate may be formed are described here, any material that may serve as a foundation upon which a semiconductor device may be built falls within the spirit and scope of the present invention. According to an embodiment, a trench isolation oxide 104 may be formed in the semiconductor substrate 102. In an embodiment, the trench isolation oxide 104 may fill the trenches in the substrate that define a plurality of fins on which the MOS transistors are formed. According to an embodiment, the trench isolation oxide 104 may be any suitable oxide, nitride, or any other insulating material. For example, the trench isolation oxide 104 may be a silicon dioxide or an oxynitride.

Each MOS transistor includes a gate stack formed of at least two layers, a gate dielectric layer 142 and a gate electrode layer 140, which are both illustrated in the cross-sectional view along the dashed line 1-1'. The gate dielectric layer 142 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 142 to improve its quality when a high-k material is used.

The gate electrode layer 140 is formed on the gate dielectric layer 142 and may consist of at least one P-type workfunction metal or N-type workfunction metal, depending on whether the transistor is to be a PMOS or an NMOS transistor. In some implementations, the gate electrode layer 140 may consist of a stack of two or more metal layers, where one or more metal layers are workfunction metal layers and at least one metal layer is a fill metal layer.

For a PMOS transistor, metals that may be used for the gate electrode 140 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 140 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In the illustrated embodiment, the gate electrode 140 may consist of a "U"-shaped structure that includes a bottom portion substantially parallel to the surface of the substrate 102 and two sidewall portions that are substantially perpendicular to the top surface of the substrate 102.

In some implementations of the invention, a pair of sidewall spacers (not shown) may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, S/D regions 115 may be formed within the substrate adjacent to the gate stack of each MOS transistor. The S/D regions 115 are generally formed using either an implantation/diffusion process or an etching/deposition process. In the former process, dopants such as boron, aluminum, antimony, phosphorous, or arsenic may be ion-implanted into the substrate to form the S/D regions 115. An annealing process that activates the dopants and causes them to diffuse further into the substrate typically follows the ion implantation process. In the latter process, the substrate 102 may first be etched to form recesses at the locations of the S/D regions 115. An epitaxial deposition process may then be carried out to fill the recesses with material that is used to fabricate the S/D regions 115. In some embodiments, the S/D regions 115 may be fabricated using a silicon or germanium alloy such as silicon germanium, silicon carbide, or germanium tin. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

In order to not unnecessarily obscure embodiments of the invention, interconnect layers and other back-end-of-line (BEOL) layers are omitted from the Figures. However, one skilled in the art will recognize that one or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organo-silicate glass. The ILD layers may include pores or air gaps to further reduce their dielectric constant.

Figure 1B:
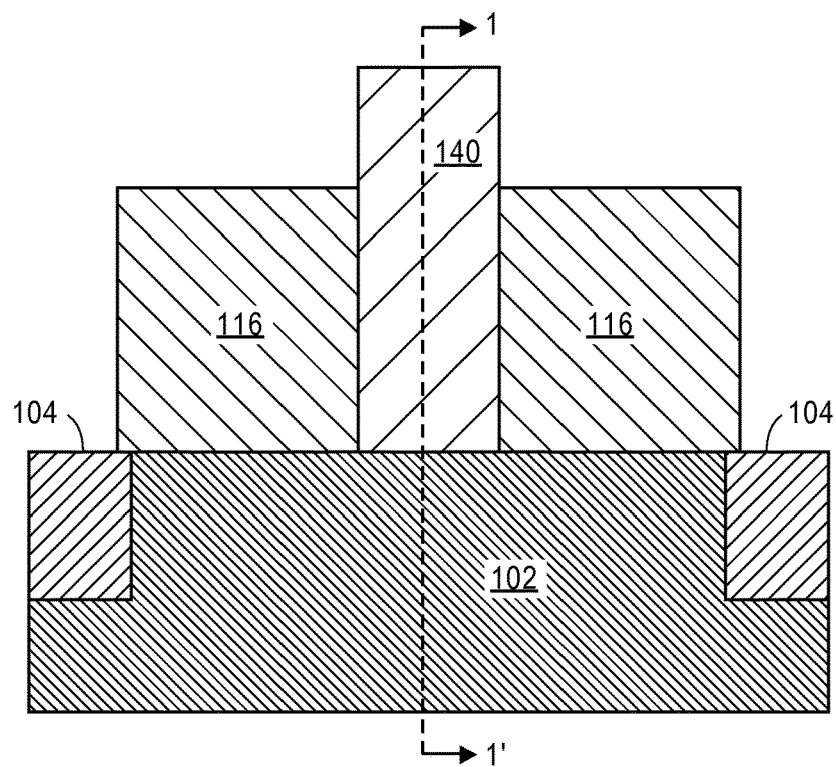
FIG. 1B is a pair of cross-sectional illustrations of a non-planar transistor that includes top-side strain inducing layers on the source/drain (S/D) regions, according to an embodiment of the invention.

Referring now to FIG. 1B, a MOS-transistor that further includes a front side strain inducing layer 116 is illustrated. As used herein, a strain inducing layer 116 may be referred to as a front side strain inducing layer 116 when it is formed over the surface of the S/D regions that are contacted with the metallic interconnects of the BEOL stack. According to an additional embodiment, the semiconductor material chosen for the strain inducing layer 116 may have a lattice constant that is smaller or greater than the lattice constant than the lattice constant of the S/D regions 115, depending on whether a compressive or tensile strain is needed.

According to an embodiment, when a smaller lattice constant is needed, the atomic percentage of a smaller element may be increased. For example, in an embodiment the S/D regions 115 may be formed with a first $In_xGa_{1-x}As$ semiconductor material and the strain inducing layer 116 may then be formed with a second $In_xGa_{1-x}As$ semiconductor material that has a lower atomic percentage of the larger element, indium (In), and a higher atomic percentage of a smaller element, such as gallium (Ga) relative to the S/D region 115. By way of example, the S/D regions 115 may be formed with an $In_{0.53}Ga_{0.47}As$ semiconductor material and the strain inducing layer 116 may be formed with an $In_{0.25}Ga_{0.75}As$ semiconductor material. The resulting mismatch between the lattice constants of the two regions in such an embodiment is approximately 2%. The substitution of Ga for In results in strain inducing layer 116 having a lattice with the same crystal structure as the lattice type of the S/D regions 115, but which also have a smaller in-plane lattice constant than the S/D regions 115. The smaller spaced lattice of the strain inducing layer 116 generates a uniaxial tensile strain in the channel region 120. Similarly, if a compressive strain in the channel region 120 is desired, the strain inducing layer 116 may be a semiconductor material with a larger lattice spacing than the S/D regions 115.

The amount of uniaxial tensile strain in the channel region 120 increases as the lattice constant mismatch between the strain inducing layer 116 and the S/D region 115 is increased. However, the increase in strain may be limited by the substrate 102 formed below the channel region 120. Accordingly, embodiments of the invention may utilize a backside reveal process to remove and/or replace the substrate 102 below the MOS transistor. A process for forming such a transistor device is illustrated in FIGS. 2A-2C.

Figure 2A:
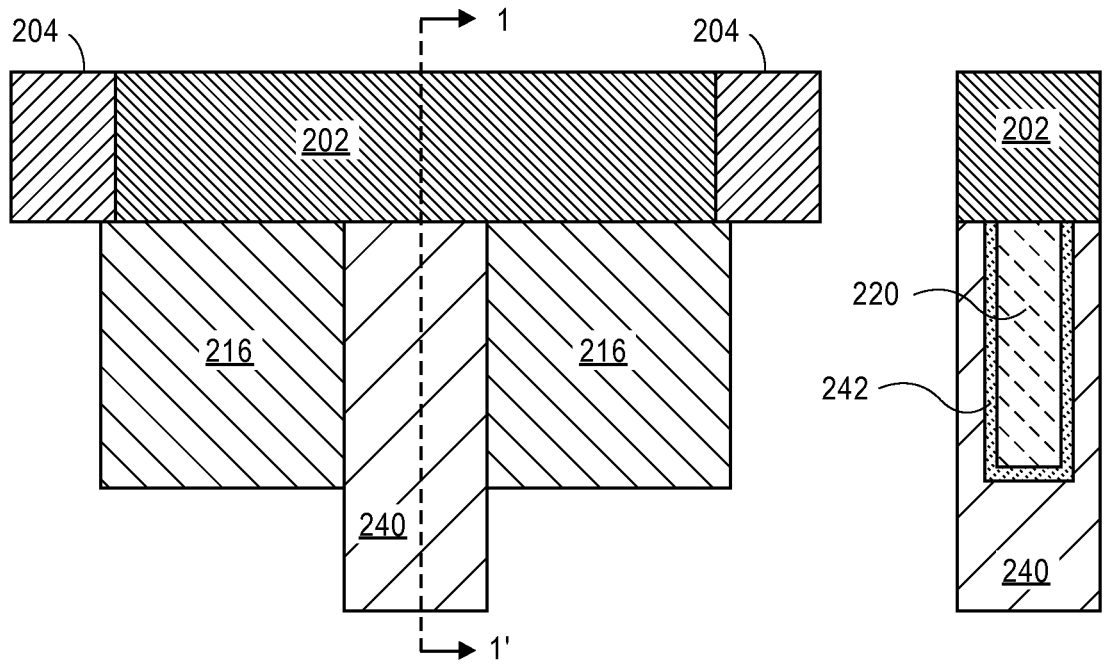
FIG. 2A is a pair of cross-sectional illustrations of a non-planar transistor after a backside reveal process has etched back a portion of the substrate, according to an embodiment of the invention.

Referring now to FIG. 2A, a pair of cross-sectional illustrations of a MOS transistor that has been flipped over is shown. According to an embodiment, the MOS transistor may be substantially similar to the MOS transistor illustrated and described in FIG. 1B except that the substrate 202 has been polished back to expose the bottom surfaces of the trench oxide 204. In an embodiment, the substrate 202 may be polished back with a chemical mechanical polishing (CMP) process. Polishing back the substrate 202 may remove substantially all of the substrate 202 except for the portions of the substrate 202 that were formed into the fin on which the MOS transistor was fabricated.

Figure 2B:
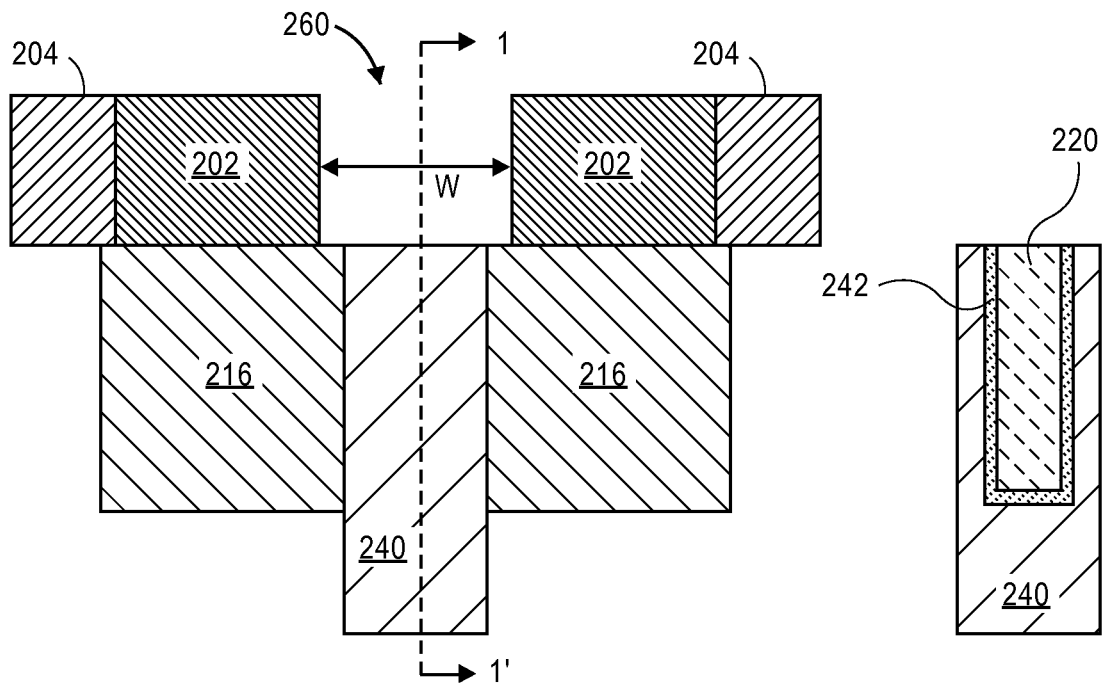
FIG. 2B is a pair of cross-sectional illustrations of FIG. 2A after a strain enhancement opening is formed in the substrate, according to an embodiment of the invention.
Figure 2C:
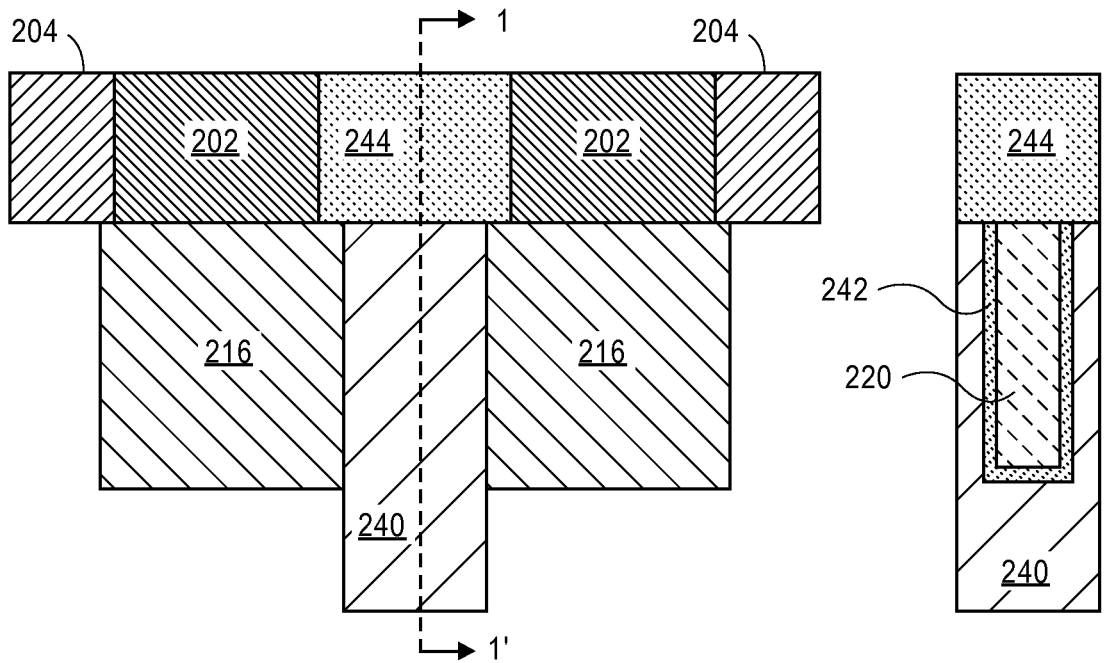
FIG. 2C is a pair of cross-sectional illustrations of FIG. 2B after a fill material has been formed in the strain enhancement opening, according to an embodiment of the invention.

Referring now to FIG. 2B, embodiments of the invention may include forming a strain enhancement opening 260 through the remaining portion of the substrate 202. The strain enhancement opening 260 may expose a bottom surface of the channel region 220, as illustrated in the cross-sectional view along dashed line 1-1'. According to an embodiment, the strain enhancement opening 260 may be formed with a width W. In some embodiments the width W of the strain enhancement opening 260 may be approximately equal to or greater than the width of the gate electrode 240. Additional embodiments of the invention include a strain enhancement opening 260 that has a width W that spans the entire distance between the trench oxide regions 204. Exposing the bottom of the channel region 220 allows for the compressive strain that is induced in the channel region 220 by the front side strain inducing layer 216 to be increased. For example, removing the substrate 202 from below the channel region 220 may allow for a thicker front side strain inducing layer 216 to be formed over the S/D regions, or for the front side strain inducing layer 216 to have a greater lattice mismatch with the S/D regions.

In addition to allowing for increased strain to be induced in the channel region 220, the formation of the strain enhancement opening 260 may also allow for a decrease in current leakage. MOS transistors continue to scale downwards in size, the current leakage through the substrate 202 may be an increasing concern. Accordingly, additional embodiments may further decrease the leakage current by forming a fill material below the channel. Such an embodiment is illustrated in FIG. 2C. According to the embodiment illustrated in FIG. 2C, a fill material 244 may be deposited into the strain enhancement opening 260 and cover portions of the channel region 220, the gate dielectric layer 242, and the gate electrode 240. In some embodiments of the invention, the backside of the MOS transistor may be polished (e.g., with a CMP process) after the fill material 244 is deposited so that a surface of the fill material 244 is substantially coplanar with the remaining portions of the substrate 202. According to an embodiment, the fill material 244 may be any suitable material that has a stiffness that is less than the stiffness of the substrate 202. As such, more strain may be induced in the channel due to the decreased stiffness of the material below the channel region 220. For example, the fill material may be an oxide, a oxynitride, a porous gap-fill interlayer dielectric, or a polysilicon. In an embodiment the fill material 244 may be the same oxide material as trench oxide material 204.

In another embodiment, the compressive strain induced by the strain inducing layer may be further enhanced by forming a backside strain inducing layer in addition to, or instead of, the front side strain inducing layer. A process for forming such an embodiment is illustrated and described with respect to FIGS. 3A-3C.

Figure 3A:
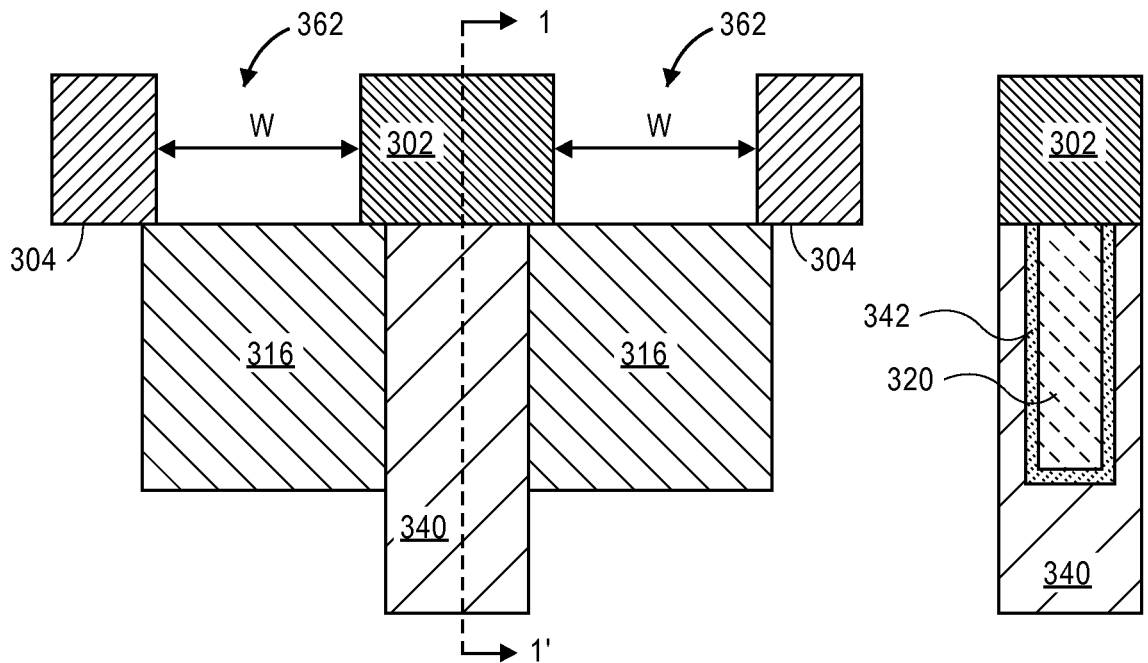
FIG. 3A is a pair of cross-sectional illustrations of a non-planar transistor after a backside reveal process has etched back a portion of the substrate and multiple strain enhancement openings are formed in the substrate, according to an embodiment of the invention.

Referring now to FIG. 3A, a pair of cross-sectional illustrations of a MOS transistor with a pair of strain enhancement openings 362 is shown, according to an embodiment of the invention. According to an embodiment, the MOS transistor is substantially similar to the MOS transistor illustrated in FIG. 2B (e.g., including a gate stack comprising a gate dielectric layer 342 and a gate electrode 340 around a channel region 320), with the exception of the number and location of the strain enhancement openings 362 being different. Instead of exposing the channel region 320, the surfaces of the S/D regions formed under the strain inducing layers 316 are exposed. The strain enhancement openings 362 may each be formed with a width W between the trench oxide 304 and substrate 302. The width W may be substantially the same width as the S/D regions. Additional embodiments may include strain enhancement openings 362 with a width W that is smaller than the width of the S/D regions.

Figure 3B:
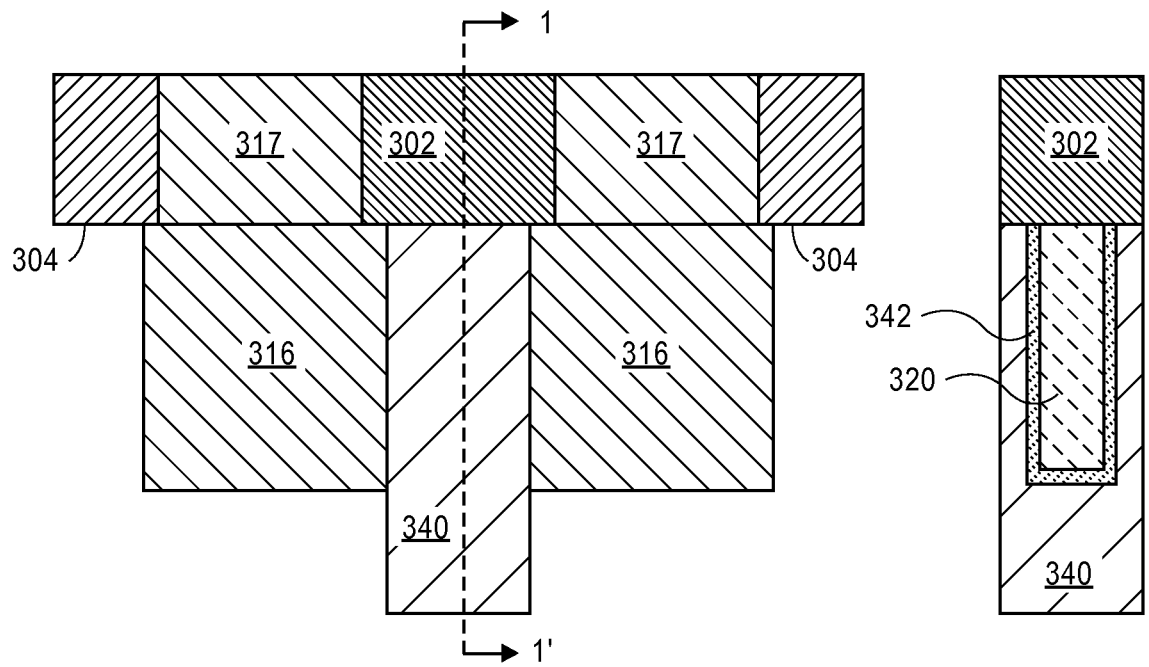
FIG. 3B is a pair of cross-sectional illustrations of FIG. 3A after the strain enhancement openings are filled with a strain inducing epitaxial layer, according to an embodiment of the invention.

Referring now to FIG. 3B, a backside strain inducing layer 317 may be epitaxially grown over the backsides of the S/D regions in the strain enhancement openings 362, according to an embodiment of the invention. The backside strain inducing layers 317 may be a semiconductor material that has a larger lattice constant than the lattice constant of the S/D regions. In one embodiment, the backside strain inducing layers 317 may be the same material as the front side strain inducing layers 316. The amount of strain induced in the channel region 320 may be increased by increasing the thickness of the backside strain inducing layers 317. In the illustrated embodiment, the backside strain inducing layers 317 are approximately the same thickness as the remaining portion of the substrate 302. Alternative embodiments may include backside strain inducing layers 317 that have a thickness that is less than the thickness of the remaining substrate 302. Increasing the strain in the channel region 320 is, however, still limited by the presence of the substrate 302 below the channel region 320. Accordingly, adding a backside strain inducing layer 317 may not provide a significant increase in the channel strain unless the substrate 302 is also removed.

Figure 3C:
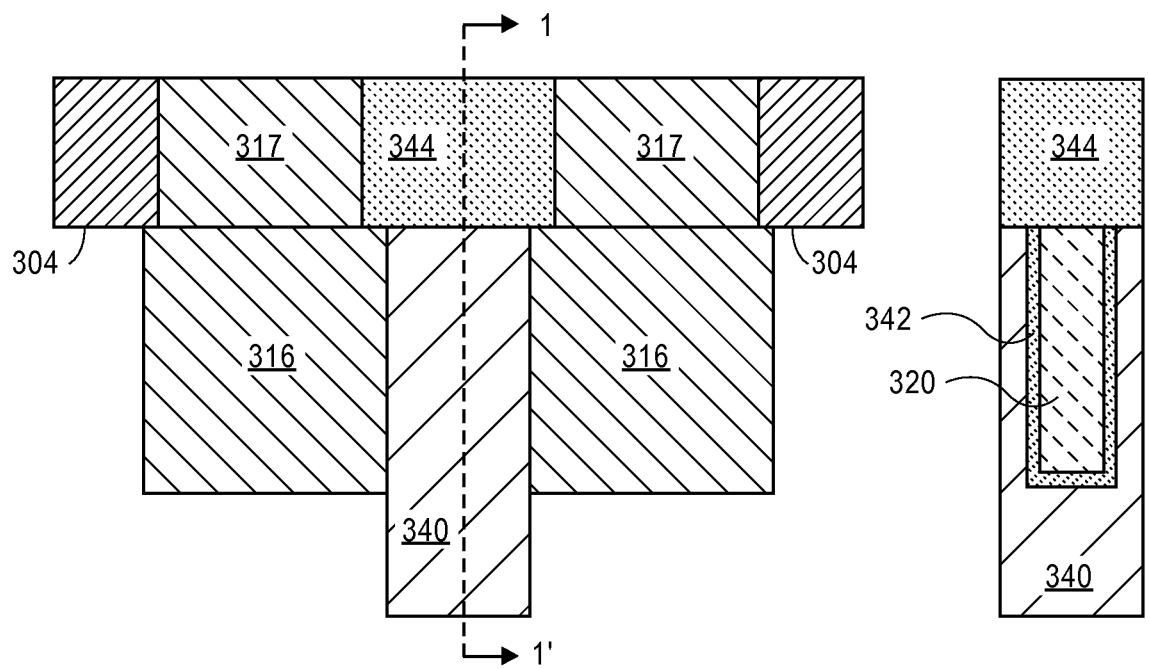
FIG. 3C is a pair of cross-sectional illustrations of FIG. 3B after the remaining portions of the substrate are removed and fill material is formed between the strain inducing epitaxial layers, according to an embodiment of the invention.

As such, embodiments of the invention may further include removing the remaining portions of the substrate 302 between the backside strain inducing layers 317, as illustrated in the cross-sectional views shown in FIG. 3C. The substrate 302 may be removed with an etching process. In some embodiments, the etching process to remove the substrate 302 may be implemented without a mask when the backside strain inducing layers 317 and the substrate 302 are materials that are etch selective to each other. The removal of the substrate 302 from below the channel will result in an increase in the strain that may be induced in the channel, as described above. Some embodiments may also include depositing a fill material 344 over the bottom surface of the channel. The deposition of the fill material 344 may reduce the current leakage, as described above. According to an embodiment, the fill material 344 may be any suitable material that has a stiffness that is less than the stiffness of the substrate 302. As such, more strain may be induced in the channel due to the decreased stiffness of the material below the channel region 320. For example, the fill material may be an oxide, a oxynitride, a porous gap-fill interlayer dielectric, or a polysilicon.

In addition to forming compressive strain in the channel, embodiments of the invention may also include MOS transistors that have tensile strained channels. A process for forming such an embodiment is illustrated and described with respect to FIGS. 4A-4C.

Figure 4A:
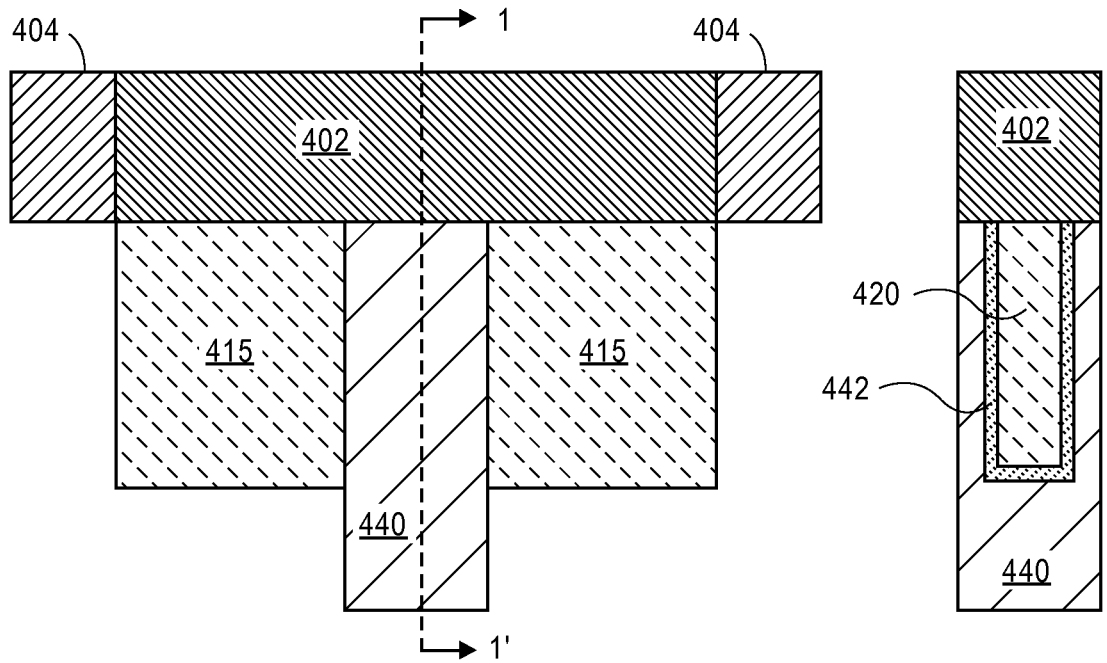
FIG. 4A is a pair of cross-sectional illustrations of a non-planar transistor after a backside reveal process has etched back a portion of the substrate, according to an embodiment of the invention.

Referring now to FIG. 4A, a cross-sectional illustration of a MOS transistor that has been flipped over is shown. According to an embodiment, the MOS transistor may be substantially similar to the MOS transistor illustrated and described in FIG. 2A with the exception that there is not a front side strain inducing layer formed over the S/D regions 415. According to an embodiment, the substrate 402 is polished back to expose the bottom surfaces of the trench oxide 404. For example, the substrate 402 may be polished back with a CMP process.

Figure 4B:
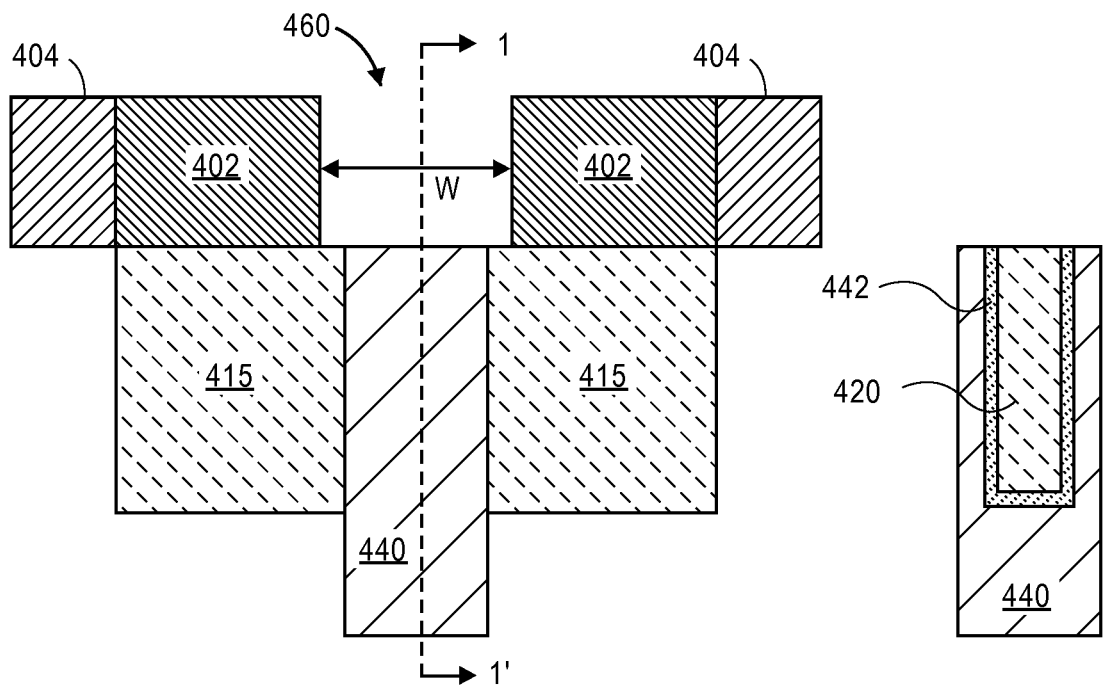
FIG. 4B is a pair of cross-sectional illustrations of FIG. 4A after a strain enhancement opening is formed in the substrate, according to an embodiment of the invention.

Referring now to FIG. 4B, embodiments of the invention may include etching a strain enhancement opening 460 through the substrate 402. The strain enhancement opening 460 may expose a bottom surface of the channel region 420, as illustrated in the cross-sectional view along dashed line 1-1'. According to an embodiment, the strain enhancement opening 460 may be formed with a width W. In some embodiments the width W of the strain enhancement opening 460 may be approximately equal to or greater than the width of the gate electrode 440.

Figure 4C:
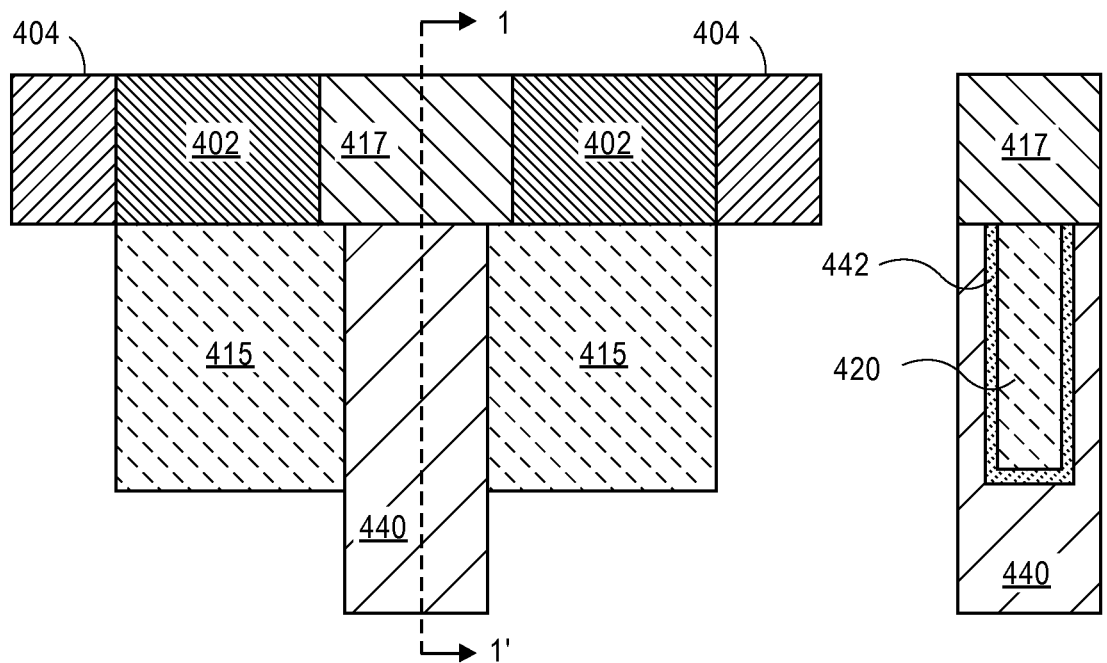
FIG. 4C is a pair of cross-sectional illustrations of FIG. 4B after a strain inducing epitaxial layer has been formed in the strain enhancement opening, according to an embodiment of the invention.

Referring now to FIG. 4C a backside strain inducing layer 417 may be epitaxially grown over the channel region 420, the gate dielectric layer 442 and the gate electrode 440 exposed by the strain enhancement opening 460. The strain inducing layer 417 may be a semiconductor material that has a larger lattice constant than the channel region 420 in order to induce the tensile strain. According to an embodiment, the thickness of the strain inducing layer 417 may be controlled to provide a desired amount of strain in the channel region 420. While the illustrated embodiment includes no front side strain inducing layer, embodiments of the invention may also include a front side strain inducing layer.

In the illustrated embodiments, the S/D regions are illustrated as being formed completely above the substrate on which they are formed. However, embodiments are not limited to such configurations. For example, the S/D regions may extend into the substrate. Embodiments with extended S/D regions may be used for embodiments that provide both compressive or tensile strain to the channel region. An exemplary embodiment that illustrates how an extended S/D region may be used to form a tensile strained channel region is illustrated with respect to FIGS. 5A-5C.

Figure 5A:
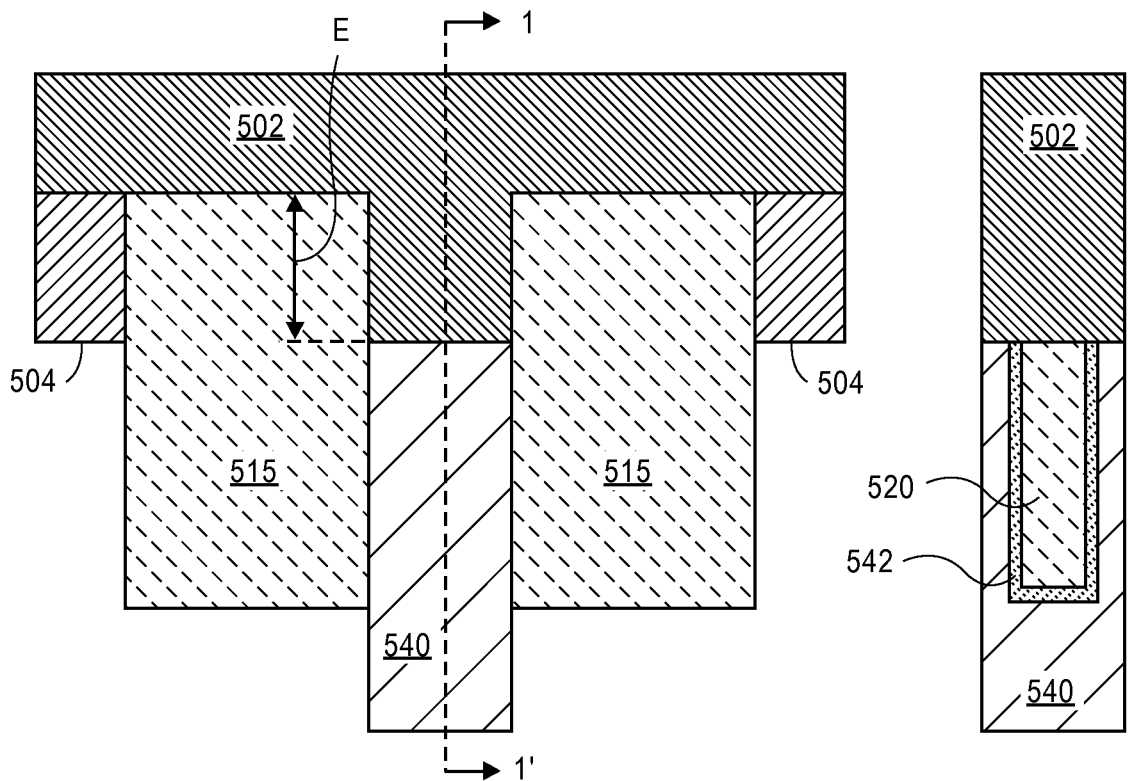
FIG. 5A is a pair of cross-sectional illustrations of a non-planar transistor with S/D regions that extend into the substrate, according to an embodiment of the invention.

Referring now to FIG. 5A, a cross-sectional illustration of a MOS transistor that has been flipped over is shown. According to an embodiment, the MOS transistor may be substantially similar to the MOS transistor illustrated and described in FIG. 1A (e.g., including a gate stack comprising a gate dielectric layer 542 and a gate electrode 540 around a channel region 520) with the exception that the S/D regions 515 extend into the substrate 502. In the illustrated embodiment, the extended S/D regions 515 extend into the substrate a depth E that is substantially equal to the depth of the trench oxide regions 504. In additional embodiments, the extended S/D regions 515 may extend a depth E that is less than the depth of the trench oxide regions 504.

Figure 5B:
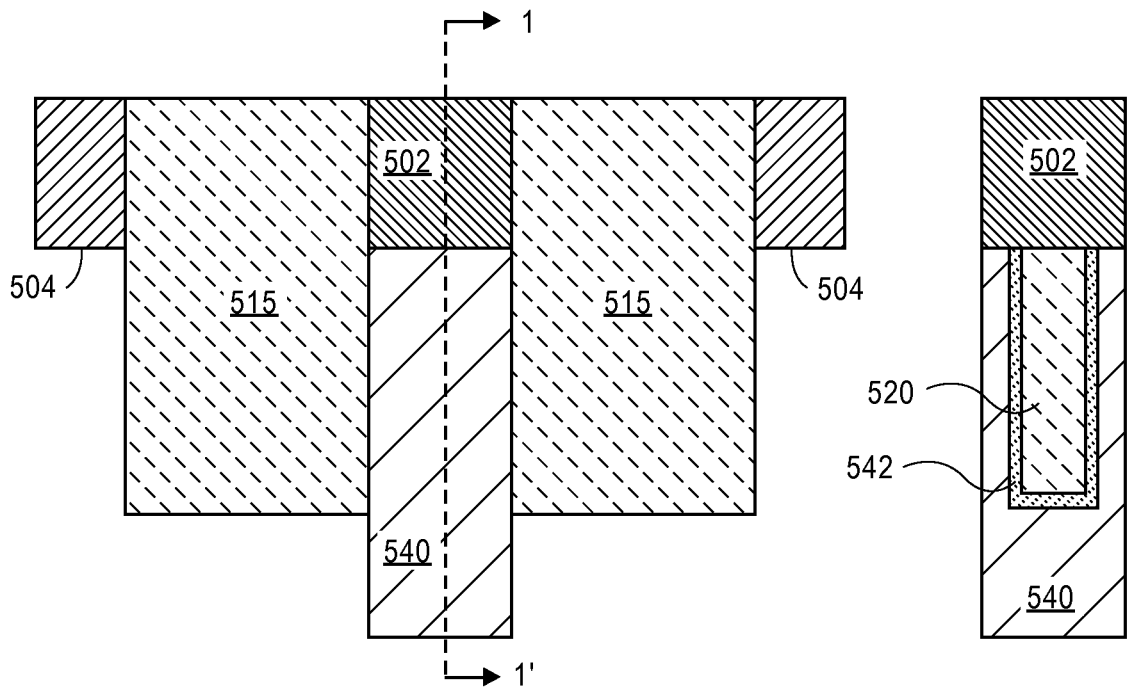
FIG. 5B is a pair of cross-sectional illustrations of FIG. 5A after a backside reveal process has etched back a portion of the substrate, according to an embodiment of the invention.

Referring now to FIG. 5B, the substrate 502 may be polished back to expose the bottom surfaces of the trench oxide 504. According to an embodiment the substrate 502 may be polished back to a depth that exposes a surface of the extended S/D regions 515. Embodiments of the invention may polish back the substrate 502 with a CMP process.

Figure 5C:
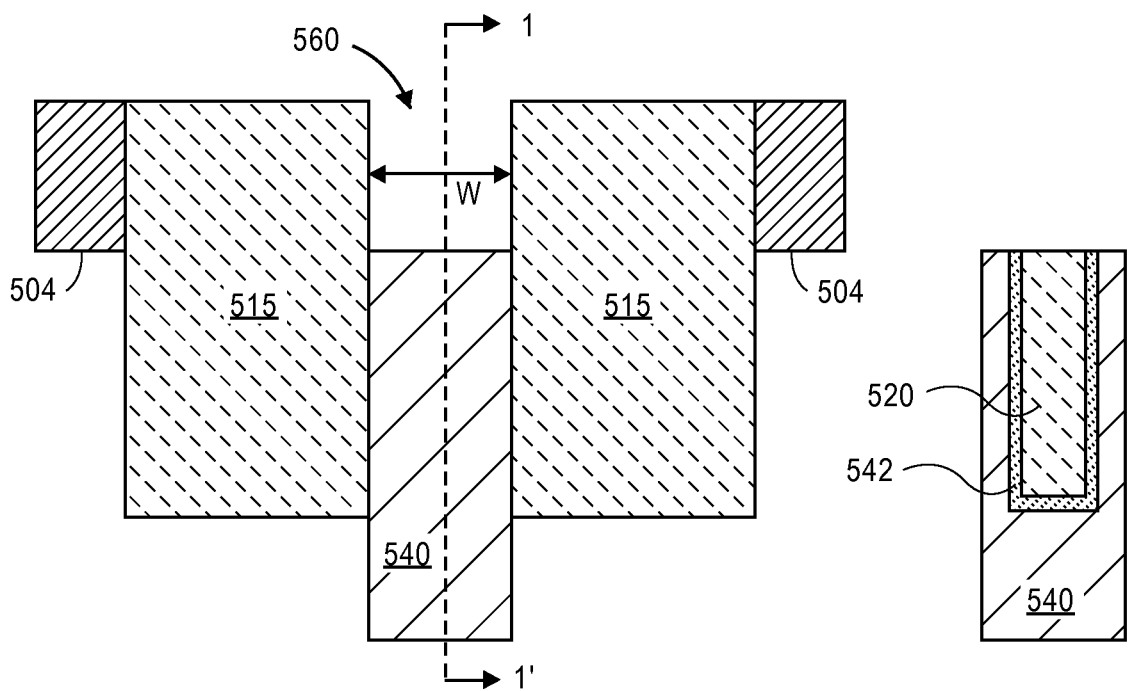
FIG. 5C is a pair of cross-sectional illustrations of FIG. 5B after a strain enhancement opening is formed in the substrate, according to an embodiment of the invention.

The use of the extended S/D regions 515 may be beneficial because the remaining portions of the substrate 502 may be a material that is etch selective to the S/D regions 515. Accordingly, when the remaining portion of the substrate 502 is removed with an etching process, an etch mask may not be needed. As illustrated in FIG. 5C, the etch selectivity between the materials may allow for the strain enhancement opening 560 to be a self-aligned opening. The strain enhancement opening 560 may be considered self-aligned because the width W of the strain enhancement opening 560 may be substantially equal to the width of the gate stack.

Figure 5D:
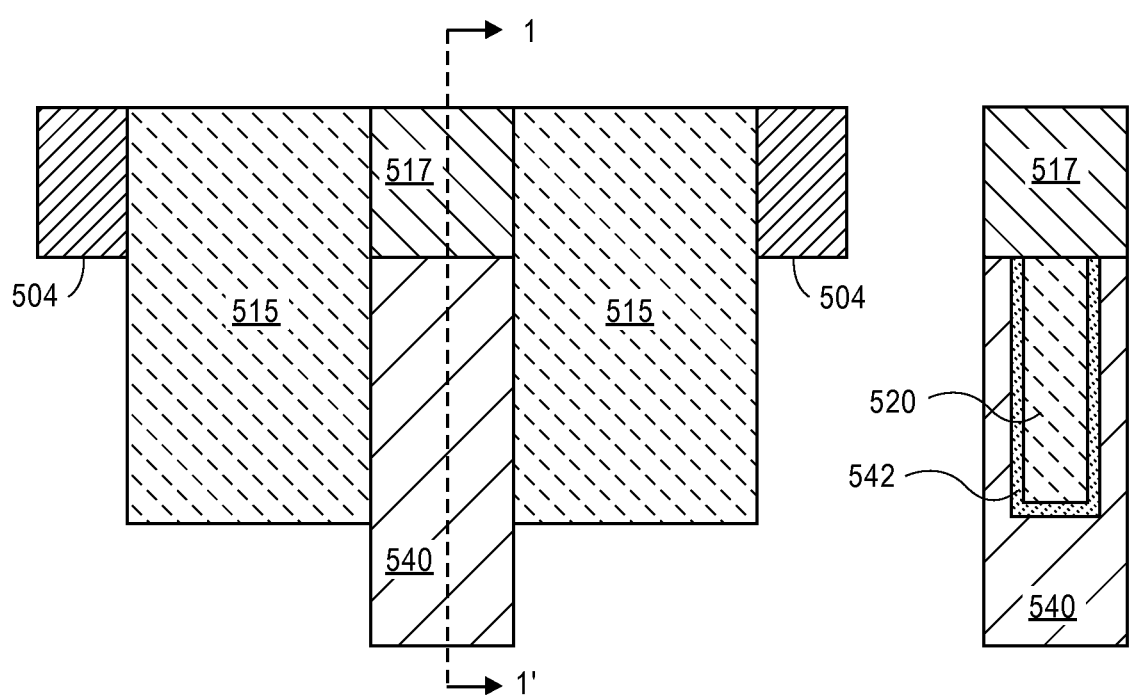
FIG. 5D is a pair of cross-sectional illustrations of FIG. 5C after a strain inducing epitaxial layer has been formed in the strain enhancement opening, according to an embodiment of the invention.

Referring now to FIG. 5D a backside strain inducing layer 517 may be epitaxially grown over the channel region 520 in the strain enhancement opening 560. The strain inducing layer 517 may be a semiconductor material that has a larger lattice constant than the channel region in order to induce the tensile strain in the channel region 520. According to an embodiment, the thickness of the strain inducing layer may be controlled to provide a desired level of strain in the channel region 520. While the illustrated embodiment includes no front side strain inducing layer, embodiments of the invention may also include a front side strain inducing layer.

Figure 6:
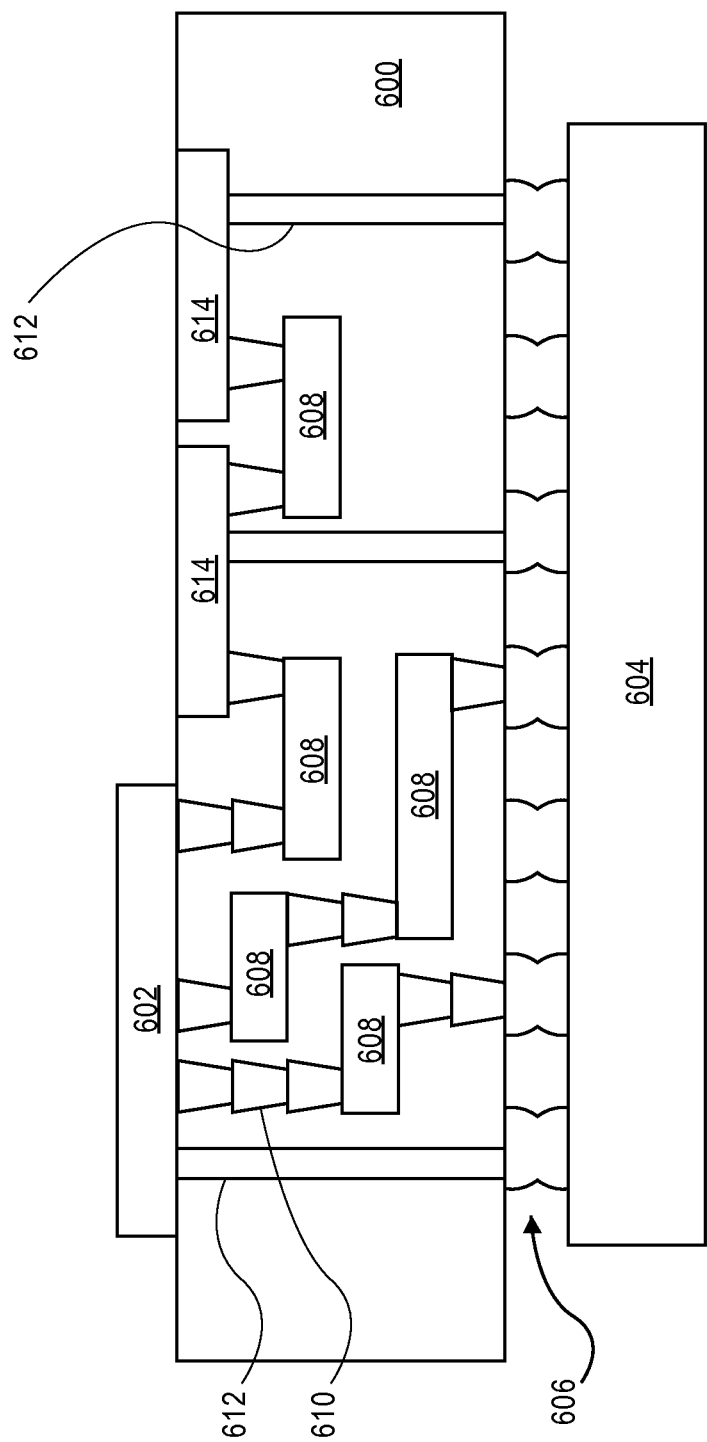
FIG. 6 is a cross-sectional illustration of an interposer implementing one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the invention, apparatuses that include non-planar transistors with a backside strain enhancement opening and/or backside strain inducing layers, or processes for forming such transistors disclosed herein may be used in the fabrication of interposer 600.

Figure 7:
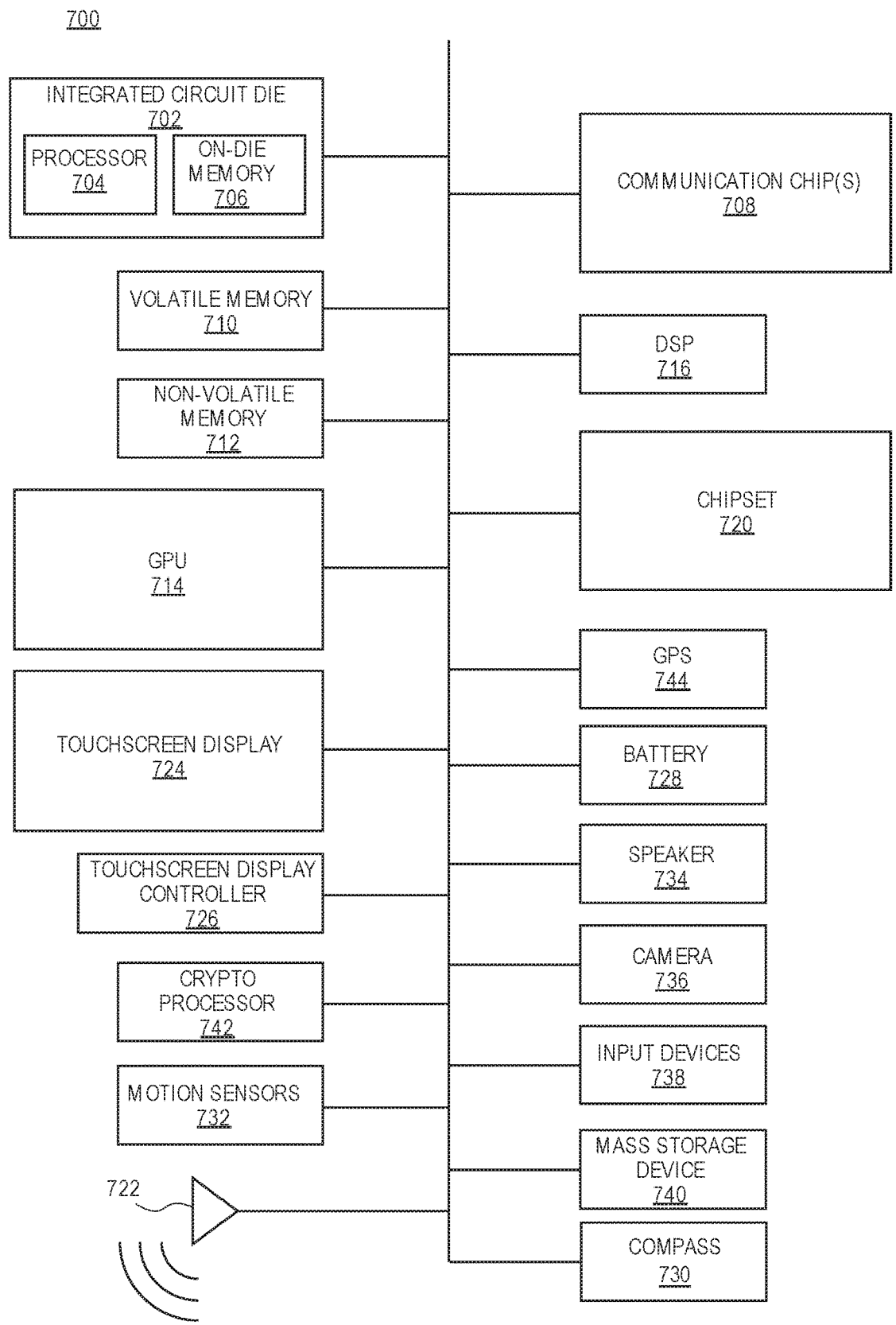
FIG. 7 is a schematic of a computing device that includes one or more transistors built in accordance with an embodiment of the invention.

FIG. 7 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a global positioning system (GPS) device 744, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The processor 704 of the computing device 700 includes one or more devices, such as vertically oriented long channel transistors, according to an embodiment of the invention. The term "processor" may refer to any device or portion of a device that processes electronic data from registers and/or memory to transform that electronic data into other electronic data that may be stored in registers and/or memory.

The communication chip 708 may also include one or more devices, such as non-planar transistors with a backside strain enhancement opening and/or backside strain inducing layers, according to an embodiment of the invention.

In further embodiments, another component housed within the computing device 700 may contain one or more devices, such as non-planar transistors with a backside strain enhancement opening and/or backside strain inducing layers, according to an embodiment of the invention.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a non-planar transistor, comprising: a semiconductor substrate; a first source/drain (S/D) region separated from a second S/D region by a channel region, wherein the first and second S/D regions are formed over the semiconductor substrate; a gate stack formed over the channel region; and a strain enhancement opening formed through the semiconductor substrate, wherein the strain enhancement opening exposes a bottom surface of the channel region.

Additional embodiments include a non-planar transistor, wherein the strain enhancement opening is filled with an oxide material.

Additional embodiments include a non-planar transistor, wherein the strain enhancement opening extends below the first and second S/D regions.

Additional embodiments include a non-planar transistor, further comprising: a front side strain inducing layer formed over the first and second S/D regions.

Additional embodiments include a non-planar transistor, further comprising: a backside strain inducing layer formed over a bottom surface of the S/D regions.

Additional embodiments include a non-planar transistor, wherein the strain enhancement opening is filled with an oxide material and a thickness of the oxide material is substantially equal to or less than a thickness of the backside strain inducing layer.

Additional embodiments include a non-planar transistor, wherein the front side strain inducing layer produces a compressive strain in the channel region.

Additional embodiments include a non-planar transistor, wherein the first and second S/D regions extend into the semiconductor substrate.

Additional embodiments include a non-planar transistor, wherein a portion of the substrate below the first and second S/D regions is removed.

Additional embodiments include a non-planar transistor, wherein the strain enhancement opening is self-aligned with the first and second S/D regions.

Additional embodiments include a non-planar transistor, wherein a backside strain inducing layer is formed in contact with the channel region in the strain enhancement opening.

Additional embodiments include a non-planar transistor, wherein tensile strain is induced in the channel region.

Embodiments of the invention include a method of forming a strained transistor device comprising: forming a non-planar metal-oxide-semiconductor (MOS) transistor over a semiconductor substrate; polishing back at least a portion of the semiconductor substrate; and forming a strain enhancement opening in the semiconductor substrate, wherein the strain enhancement opening exposes a bottom surface of at least a channel region of the MOS transistor.

Additional embodiments include a method, further comprising: depositing an oxide material in the strain enhancement opening.

Additional embodiments include a method, wherein forming a non-planar MOS transistor includes forming a strain inducing layer over a surface of a first source/drain (S/D) region and a second S/D region.

Additional embodiments include a method, further comprising: forming a backside strain inducing layer over bottom surfaces of the first and second S/D regions proximate to the strain enhancement opening.

Additional embodiments include a method, wherein the strain enhancement opening exposes bottom surfaces of a first source/drain (S/D) region and a second S/D region.

Additional embodiments include a method, wherein the non-planar MOS transistor comprises a first source/drain (S/D) region and a second S/D region that extend into the semiconductor substrate.

Additional embodiments include a method, wherein forming the strain enhancement opening includes etching the semiconductor substrate below the channel region, wherein the semiconductor substrate is selectively etched with respect to the first and second S/D regions.

Additional embodiments include a method, further comprising: forming a backside strain inducing layer over the channel region exposed by the strain enhancement opening.

Additional embodiments include a method, wherein the backside strain inducing layer has a thickness that is approximately as thick as the semiconductor substrate formed below the non-planar MOS transistor.

Embodiments of the invention include a non-planar transistor comprising: a semiconductor substrate; a first source/drain (S/D) region separated from a second S/D region by a channel region, wherein the first and second S/D regions are formed over the semiconductor substrate, wherein a strain inducing layer is formed over top surfaces of the first and second S/D regions; a gate stack formed over the channel region, wherein the gate stack comprises a gate dielectric formed in contact with the channel region and a gate electrode formed over the gate dielectric; a strain enhancement opening formed through the semiconductor substrate, wherein the strain enhancement opening exposes a bottom surface of the channel region; and an oxide material filling the strain enhancement opening.

Additional embodiments of the invention include a non-planar transistor, further comprising: a backside strain inducing layer formed over the back surfaces of the first and second S/D regions.

Additional embodiments of the invention include a non-planar transistor, wherein the backside strain inducing layer has a thickness that is approximately equal to or less than a thickness of the oxide material.

Additional embodiments of the invention include a non-planar transistor, wherein the first and second S/D regions extend into the semiconductor substrate, and wherein the strain enhancement opening is self-aligned with the first and second S/D regions.

What is claimed is:

1. A non-planar transistor comprising:
   a semiconductor substrate having a first surface and a second surface opposite from the first surface;
   a first source/drain (S/D) region separated from a second S/D region by a channel region, wherein the first and second S/D regions are formed over the first surface of the semiconductor substrate;
   a gate stack formed over the channel region, wherein the gate stack is positioned over sidewalls and a top surface of the channel region;
   a strain enhancement opening formed entirely through a thickness of the semiconductor substrate between the first surface and the second surface, wherein the strain enhancement opening exposes a bottom surface of the channel region; and
   a fill material in the strain enhancement opening, wherein the fill material contacts a surface of the channel region, and wherein the fill material has a stiffness that is less than a stiffness of the semiconductor substrate.

2. The non-planar transistor of claim 1, wherein the fill material is an oxide material.

3. The non-planar transistor of claim 1, wherein the strain enhancement opening extends below the first and second S/D regions.

4. The non-planar transistor of claim 1, further comprising: a front side strain inducing layer formed over the first and second S/D regions.

5. The non-planar transistor of claim 4, further comprising: a backside strain inducing layer formed over a bottom surface of the S/D regions.

6. The non-planar transistor of claim 5, wherein the fill material is an oxide material and a thickness of the oxide material is substantially equal to or less than a thickness of the backside strain inducing layer.

7. The non-planar transistor of claim 4, wherein the front side strain inducing layer produces a compressive strain in the channel region.

8. The non-planar transistor of claim 1, wherein the first and second S/D regions extend into the semiconductor substrate.

9. The non-planar transistor of claim 8, wherein a portion of the semiconductor substrate below the first and second S/D regions is removed.

10. The non-planar transistor of claim 8, wherein the strain enhancement opening is self-aligned with the first and second S/D regions.

11. A method of forming a strained transistor device comprising:
   forming a non-planar metal-oxide-semiconductor (MOS) transistor over a semiconductor substrate, wherein the non-planar MOS transistor comprises a first S/D region, a second S/D region, and a channel region between the first S/D region and the second S/D region, wherein the semiconductor substrate has a first surface and a second surface opposite from the first surface, and wherein the first S/D region and the second S/D region are disposed over the first surface;
   polishing back at least a portion of the semiconductor substrate, wherein the polishing recess the second surface; and
   forming a strain enhancement opening entirely through a thickness of the semiconductor substrate between the first surface and the second surface, wherein the strain enhancement opening exposes a bottom surface of at least a channel region of the MOS transistor, wherein forming the strain enhancement opening includes etching the semiconductor substrate below the channel region, wherein the semiconductor substrate is selectively etched with respect to the first and second S/D regions.

12. The method of claim 11, further comprising:
   depositing an oxide material in the strain enhancement opening.

13. The method of claim 11, wherein forming a non-planar MOS transistor includes forming a strain inducing layer over a surface of the first source/drain (S/D) region and the second S/D region.

14. The method of claim 13, further comprising:
   forming a backside strain inducing layer over bottom surfaces of the first and second S/D regions proximate to the strain enhancement opening.

15. The method of claim 11, wherein the strain enhancement opening exposes bottom surfaces of the first source/drain (S/D) region and the second S/D region.

16. The method of claim 11, wherein the first source/drain (S/D) region and the second S/D region extend into the semiconductor substrate.

17. The method of claim 11, further comprising: forming a backside strain inducing layer over the channel region exposed by the strain enhancement opening.

18. The method of claim 17, wherein the backside strain inducing layer has a thickness that is approximately as thick as the semiconductor substrate formed below the non-planar MOS transistor.

19. A non-planar transistor comprising:
   a semiconductor substrate having a first surface and a second surface opposite from the first surface;
   a first source/drain (S/D) region separated from a second S/D region by a channel region, wherein the first and second S/D regions are formed over the semiconductor substrate, wherein a strain inducing layer is formed over top surfaces of the first and second S/D regions, and wherein the first S/D region and the second S/D region are disposed over the first surface;
   a gate stack formed over the channel region, wherein the gate stack comprises a gate dielectric formed in contact with the channel region and a gate electrode formed over the gate dielectric, wherein the gate stack is positioned over sidewalls and a top surface of the channel region;
   a strain enhancement opening formed entirely through a thickness of the semiconductor substrate between the first surface and the second surface, wherein the strain enhancement opening exposes a bottom surface of the channel region; and an oxide material filling the strain enhancement opening, wherein the oxide material contacts a surface of the channel region.

20. The non-planar transistor of claim 19, further comprising: a backside strain inducing layer formed over the back surfaces of the first and second S/D regions.

21. The non-planar transistor of claim 20, wherein the backside strain inducing layer has a thickness that is approximately equal to or less than a thickness of the oxide material.

22. The non-planar transistor of claim 19, wherein the first and second S/D regions extend into the semiconductor substrate, and wherein the strain enhancement opening is self-aligned with the first and second S/D regions.

* * * * *